United States Patent [19]

Hanada

[11] Patent Number: 5,248,383

[45] Date of Patent: Sep. 28, 1993

[54] PROCESS FOR PRODUCING CUTTING DIES

[75] Inventor: Yozaburo Hanada, Tokyo, Japan

[73] Assignee: Lintec Corporation, Tokyo, Japan

[21] Appl. No.: 927,076

[22] Filed: Aug. 7, 1992

[30] Foreign Application Priority Data

Aug. 9, 1991 [JP] Japan .................................. 3-200914

[51] Int. Cl.$^5$ ............................ B44C 1/22; C23F 1/00
[52] U.S. Cl. ................................. 156/651; 156/659.1; 156/510; 156/905
[58] Field of Search ............... 156/640, 654, 645, 651, 156/654, 656, 659.1, 661.1, 664, 510, 515, 528, 250, 251, 261, 905

[56] References Cited

U.S. PATENT DOCUMENTS

| 3,045,321 | 7/1962 | McDermott | 29/78 |
| 3,758,350 | 9/1973 | Weglin | 156/659.1 X |
| 4,102,735 | 7/1978 | Weglin | 156/661 |
| 4,264,410 | 4/1981 | Frantzen | 156/654 X |
| 4,497,686 | 2/1985 | Weglin | 156/905 X |

FOREIGN PATENT DOCUMENTS 0476664 3/1992 European Pat. Off. .
2066162 7/1981 United Kingdom .

Primary Examiner—William A. Powell
Attorney, Agent, or Firm—Webb, Burden, Ziesenheim & Webb

[57] ABSTRACT

Processes for producing cutting dies disclosed herein comprise a step of forming on a steel plate a resist, a first etching step of etching this steel plate to form a convex portion having a prescribed height thereon, and a second etching step comprising removing the resist extending from both ends of the top of the convex portion, followed by etching. In the present invention, is is possible to carry out the second etching step several times and also possible to etching further the steel plate after removal of all of the resist remaining on the top of the convex portion. According to the present invention, there are obtained cutting dies having a sharp cutting edge and an arbitrary width of the bottom portion of the edge.

2 Claims, 2 Drawing Sheets

PROCESS FOR PRODUCING CUTTING DIES

FIELD OF THE INVENTION

This invention relates to a process for producing dies and more particularly to such a process as capable of producing dies having a sharp cutting edge high in height and arbitrary in width of the bottom portion of the edge, and to the dies obtained by this process.

BACKGROUND OF THE INVENTION

As one of the processes for producing dies used for cutting an adhesive tape such as a label or marker into a prescribed form, it is known to produce the dies having a prescribed cutting pattern (convex portion) by forming on a steel plate such as a low carbon steel or the like a resist so as to correspond to said cutting pattern, followed by etching treatment. This conventional process for producing dies as mentioned above, however, involves such problems that in some cases no edge having a good height is obtained or a cutting edge obtained is found dull.

With the view of solving such problems as mentioned above, there have been proposed die-producing processes relying on the two-step etching (Japanese Patent Publication No. 10000/1977 and 27938/1982, Japanese Patent L-0-P Publn. No. 105980/1988).

In the process for producing dies relying on the two-step etching, a resist corresponding to a cutting pattern is formed on a steel plate, the steel plate is subjected to etching treatment to form a convex portion corresponding to the cutting pattern, the resist remaining on the top of the convex portion is removed therefrom, and the steel plate thus treated is subjected again to etching treatment so that said convex portion is processed so as to have a sharp edge thereon.

In the prior art processes as mentioned above, the end portion of the resist (so-called burr) hangs down to cover the top of the convex portion with the progress of the etching treatment, and therefore the vicinity of the top of the convex portion is not etched and the center portion of the side of the convex portion is liable to etching (side etching). In a word, there were involved such problems that because of inequality of the side etching at the side of the convex portion which makes the center portion of said convex portion thinner, said convex portion will decrease in strength or will break.

OBJECT OF THE INVENTION

The present invention intends to solve the above mentioned problems, and an object of the present invention is to provide such die-producing processes which are capable of producing dies having a sharp cutting edge which is high in height and arbitrary in width of the bottom of the edge, and to provide dies as may be obtained thereby.

SUMMARY OF THE INVENTION

The first process for producing dies of the present invention is characterized by comprising a step of forming on a steel plate a resist corresponding to the shape of an edge portion to be formed, a first etching step of subjecting the steel plate having the resist formed thereon to etching treatment, thereby forming a convex portion of a prescribed height in the place where the resist has been formed, a second etching step comprising removing the resist extending from both ends of the top of the convex portion and then subjecting the steel plate, in which the resist extending from both ends of the convex portion has been removed, to etching treatment, and a resist removal step comprising removing the resist remaining on the top of the convex portion, wherein said second etching treatment is carried out at least once.

The second process for producing dies of the invention is characterized in that an additional etching (a third etching step) is added subsequently to the resist removal step to the first process for producing dies.

The dies of the present invention are characterized in that they are produced by any one of the above-mentioned processes for producing dies.

According to the first process of the present invention as mentioned above, it becomes possible to produce dies having a sharp cutting edge which is high in height and arbitrary in width of the bottom of the edge, because the side of the convex portion can be etched uniformly.

Further, according to the second process of the invention which includes additionally the third etching step as mentioned above, it becomes possible to produce dies having a further sharpened cutting edge. Furthermore, according to the processes for producing dies of the present invention as mentioned above, when the cutting edge having a prescribed shape cannot be obtained or the cutting edge loses the prescribed shape during the steps before the second etching step, or when the cutting edge having a prescribed shape is not obtained or the cutting edge loses the prescribed shape for the reasons such as the occurrence of unexpected circumstances or the like during the steps before the resist removal step, it becomes possible to overcome such undesirable phenomena as mentioned above and, eventually the cutting edge having a prescribed shape can be formed.

1 . . . Steel plate
2, 4 . . . Resist
3 . . . Convex portion

DETAILED DESCRIPTION OF THE INVENTION

The processes for producing dies of the present invention are illustrated below in detail with reference to the accompanying drawings.

Figure 1:
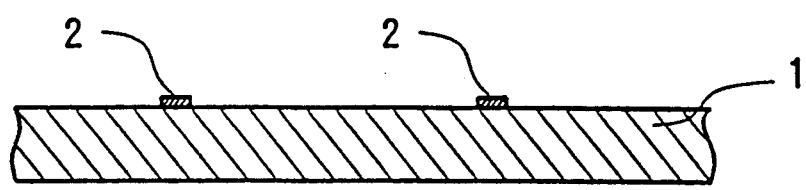
FIG. 1 through FIG. 5 are given to illustrate an outline of a flow of the steps of the process for producing dies of the present invention.

In the present invention, a resist 2 corresponding to the contour of a label to be prepared is first formed on a steel plate 1 (FIG. 1). The steel plate 1 used herein without any particular limitations includes plates of metals such as carbon steel, stainless steel and the like, and the thickness of the steel plate 1 used is not particularly limited. When the die formed from the steel plate is used by fitting it over a roller, said steel plate desirably has an appropriate flexibility, and when said die is used as a flat base cutter, said steel plate desirably has an appropriate stiffness. Further, when the dies is used as a flat base cutter, it is also possible to support the die with a metallic plate or synthetic resin plate having an appropriate stiffness with the view of reinforcing said die used as a flat base cutter.

The resist 2 may be formed on the steel plate 1 by employing various film-forming methods known per se.

The the resist 2, which becomes later on a criterion of width of an edge of the die, is usually 100-1000 μm, and said width may be selected optionally according to the purpose for which the die is used.

Figure 2:
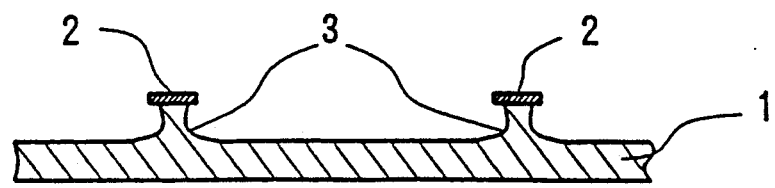

Subsequently, the steel plate 1 on which the resist 2 has been formed is subjected to etching treatment (the first etching step), thereby forming a convex portion 3 having a prescribed height in the position where the resist 2 has been formed (FIG. 2). The etchant used herein may include various known etching agents such as ferric chloride, hydrochloric acid, nitric acid or mixtures thereof. The etching time employed, though it varies according to the kind of the etchant used, is usually 10-120 minutes, and the height of the convex portion formed by this etching treatment is usually 70-900 μm in connection with the width of the resist 2.

Figure 3:
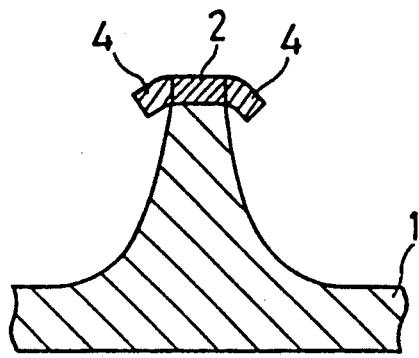

Next, the resist (burr) extending from both ends of the top of the convex portion 3 formed in the above manner is removed by means of a grinder, router or the like (a resist removal treatment in the second etching step) (FIG. 3). By the resist extending from both ends of the top of the convex portion 3 as used herein is meant a portion of the resist jutted from the top of the convex portion 3.

In FIG. 3, a diagonal line portion 4 is the portion of the resist jutted from the top of the convex portion 3, and this portion is removed therefrom.

The above-mentioned resist removal treatment is carried out in the second etching step with the view of inhibiting uneven side etching of the side of the convex portion that is seen in the conventional etching methods, and of preventing decrease in height of the resulting edge. By virtue of this resist removal treatment, it is possible to produce dies having a sharp cutting edge which is high in height and sufficient in width of the bottom portion of the edge.

Figure 4:
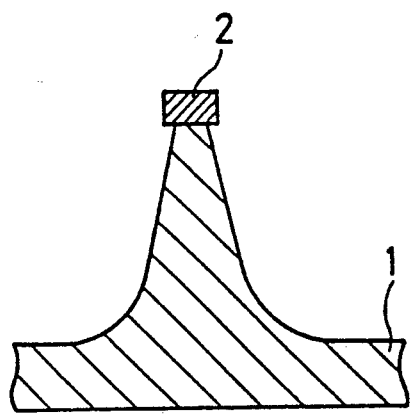

Subsequently, the steel plate in which the resist (burr) extending from both ends of the top of the convex portion 3 has been removed is subjected to etching treatment, thereby forming an edge portion (this step is called the second etching step) (FIG. 4).

According to the purpose for which the resulting die is used, moreover, it is also possible to carry out the second etching several times. In a word, the second etching is carried out 1 to 5 times, preferably 1 to 3 times, particularly 1 to 2 times.

That is, after the second etching step as mentioned above, it is also possible to carry out again said second etching step of removing the end portion of the resist hanging down from the top of the convex portion 3, followed by etching treatment.

After completion of this second etching step, the desired die is obtained by carrying out a resist removal step of removing the resist remaining on the top of the convex portion 3, followed by rinsing the steel plate, if necessary.

Figure 5:
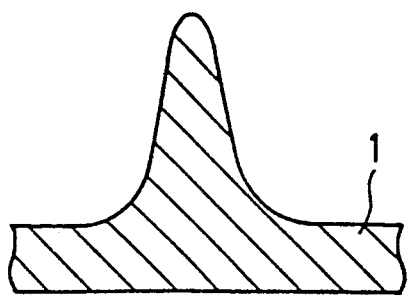

Furthermore, subsequently to the resist removal treatment, it is possible that the steel plate is again etched to sharpen the tip of the cutting edge, correct the width of the tip of the cutting edge when said width is excessively narrow, or adjust properly width of the point portion of the cutting edge or height of the cutting edge (FIG. 5).

In the second and third etching steps, there may be used various etchant known per se in the same way as in the first etching step. Further, the etching time employed, though it varies according to the etchant used, is usually 0.5-50 minutes.

By virtue of the second etching step, the side etching of the side of the convex portion can be performed uniformly, hence the die having the edge portion sufficient in width of the bottom portion of the edge and in height can be obtained.

The height of the die thus obtained is about 70-900 μm. The dies of the present invention as illustrated above have a cutting edge sufficient in width of the bottom portion of the edge as well as in height, and sharp in tip of the edge, hence they are durable, less in abrasion and sharp.

EFFECT OF THE INVENTION

According to the processes for producing dies, the side of the convex portion is etched uniformly in the second etching step, and the sharp cutting edge is obtained by means of the third etching step, hence there can be produced durable, less in abrasion and sharp dies having sufficient width of the bottom portion of the edge, sufficient height of the edge and sharp tip of the edge.

The present invention is illustrated below with reference to concrete examples, but it is construed that the invention is in no way limited to those examples.

Example 1

A resist of 600 μm in width corresponding to the shape of a die was formed by the known method on a carbon steel plate, and this steel plate was subjected to the first etching (spray pressure 0.8 kg/cm$^2$) for 30 minutes with an etchant (ferric chloride, 30° C.), thereby forming a convex portion of 500 μm in height. The width of the top for the convex portion was 300 μm, and therefore an excess resist of 300 μm at the both ends of the top for the convex portion was removed by means of a router. Thereafter, the steel plate was subjected to the second etching for 20 minutes under the same conditions as in the first etching, washed with water, and the resist on the top of the convex portion was removed, whereby a die in which the height of the cutting edge was 780 μm and the width of the top of the convex portion was 130 μm.

Example 2

In the same manner as in Example 1, a resist of 750 μm in width was formed on a carbon steel plate, and the steel plate was subjected to the first etching (spray pressure 0.8 kg/cm$^2$) for 15 minutes with an etchant (ferric chloride 30° C.), thereby forming a convex portion of 230 μm in height. The width of the top of the convex portion was 550 μm, and therefore an excess resist of 200 μm was removed by means of a router, followed by etching for 10 minutes (the second etching of the first time), whereby the height of the convex portion formed was 400 μm and the width of the top of the convex portion was 350 μm.

After removing an excess resist of 200 μm at the both ends of the top of the convex portion, the steel plate was subjected for 5 minutes to etching (the second etching step of the second time), whereby the height of the convex portion formed was 470 μm and the width of the top of the convex portion was 100 μm. After removal of the resist on the top of the convex portion, the steel plate was etched (the third etching step) for 1 minute, washed with water and dried to obtain a die. The die thus obtained had a height of 500 μm and a cutting edge which is not trapezoidal but is round and sharp.

Comparative Example 1

On a hardened steel plate, was formed a resist of 500 μm in width corresponding to the shape of a die, and the steel plate was subjected for 50 minutes to etching with an etchant (ferric chloride), thereby forming a convex portion of 400 μm in height.

Subsequently, the resist remaining on the top of the convex portion was removed therefrom, the steel plate was subjected for 3 minutes to etching with an etchant (ferric chloride), followed by rinsing. The die thus obtained had a cutting edge of 380 μm in height at the highest, said cutting edge being dull and slender at the center portion of projected portion of the edge.

What is claimed is:

1. A process for producing cutting dies, said process comprising
    a step of forming on a steel plate a resist corresponding to the shape of an edge portion to be formed thereon,
    a first etching step of subjecting the steel plate, on which the resist has been formed, to etching treatment, thereby forming a convex portion having a prescribed height in a place where the resist has been formed,
    a second etching step comprising removing the resist extending from both ends of the top of the convex portion, followed by subjecting the steel plate, in which the resist extending from both ends of the top of the convex portion has been removed, to etching, and
    a resist removal step of removing the resist remained on the top of the convex portion, wherein the aforesaid second etching step is carried out at least one time or more.

2. A process for producing cutting dies, said process comprising
    a step of forming on a steel plate a resist corresponding to the shape of an edge portion to be formed thereon,
    a first etching step of subjecting the steel plate, on which the resist has been formed, to etching treatment, thereby forming a convex portion having a prescribed height in a place where the resist has been formed,
    a second etching step comprising removing the resist extending from both ends of the top of the convex portion, followed by subjecting the steel plate, in which the resist extending from both ends of the top of the convex portion has been removed, to etching,
    a resist removal step of removing the resist remained on the top of the convex portion, and
    a third etching step of subjecting the steel plate from which all the resist has been removed to etching treatment, wherein the aforesaid second etching step is carried out at least one time or more.

* * * * *